(12) United States Patent
Gan et al.

(10) Patent No.: US 7,541,229 B2
(45) Date of Patent: Jun. 2, 2009

(54) THIN FILM TRANSISTOR AND METHOD FOR FABRICATING SAME

(75) Inventors: Feng-Yuan Gan, Hsin-Chu (TW); Han-Tu Lin, Tai-Chung Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 117 days.

(21) Appl. No.: 10/904,377

(22) Filed: Nov. 7, 2004

(65) Prior Publication Data

US 2006/0024866 A1    Feb. 2, 2006

(30) Foreign Application Priority Data

Jul. 27, 2004    (TW)    ............... 93122446 A

(51) Int. Cl.
*H01L 21/00* (2006.01)
*H01L 21/84* (2006.01)

(52) U.S. Cl. .................................... 438/158

(58) Field of Classification Search ......... 438/158–161, 438/164, 166
See application file for complete search history.

(56) References Cited

U.S. PATENT DOCUMENTS

| 5,053,354 | A | * | 10/1991 | Tanaka et al. | ............... 438/158 |
| 5,184,200 | A |   | 2/1993  | Yamanobe |  |
| 5,273,919 | A | * | 12/1993 | Sano et al. | ............... 438/158 |
| 5,340,758 | A | * | 8/1994  | Wei et al. | ............... 438/158 |
| 5,614,728 | A | * | 3/1997  | Akiyama | ............... 257/57 |
| 5,834,345 | A |   | 11/1998 | Shimizu |  |
| 6,078,059 | A |   | 6/2000  | Nakata |  |
| 6,285,041 | B1 | * | 9/2001 | Noguchi | ............... 257/61 |
| 6,395,586 | B1 | * | 5/2002 | Huang et al. | ............... 438/149 |
| 2002/0127887 | A1 | * | 9/2002 | Uehara et al. | ............... 438/800 |
| 2003/0207507 | A1 | * | 11/2003 | Gosain et al. | ............... 438/166 |
| 2004/0084678 | A1 | * | 5/2004 | Peng et al. | ............... 257/72 |
| 2005/0053720 | A1 | * | 3/2005 | Yamazaki et al. | ............... 427/69 |

FOREIGN PATENT DOCUMENTS

| JP | H03-195062 A | 8/1991 |
| JP | H09-092841 A | 4/1997 |
| JP | 2004-146691 A | 5/2004 |

OTHER PUBLICATIONS

Wolf et al., Silicon Processing for the VLSI Era vol. 1: Process Technology, pp. 539-550, © 1990.*

* cited by examiner

*Primary Examiner*—M. Wilczewski
*Assistant Examiner*—Seth Barnes
(74) *Attorney, Agent, or Firm*—Winston Hsu

(57) ABSTRACT

A method for forming a thin film transistor on a substrate is disclosed. A gate electrode and a gate insulation layer are disposed on a surface of the substrate. A deposition process is performed by utilizing hydrogen diluted silane to form a silicon-contained thin film on the gate insulation layer first. A hydrogen plasma etching process is thereafter performed. The deposition process and the etching process are repeated for at least one time to form an interface layer. Finally, an amorphous silicon layer, $n^+$ doped Si layers, a source electrode, and a drain electrode are formed on the interface layer.

22 Claims, 14 Drawing Sheets

THIN FILM TRANSISTOR AND METHOD FOR FABRICATING SAME

BACKGROUND OF INVENTION

1. Field of the Invention

The invention relates to a method for fabricating a thin film transistor and related circuits, and more particularly, to a method with improved carrier mobility and stable threshold voltage.

2. Description of the Prior Art

In recent years, various display techniques have been developed flourishingly. After continuous research and development, new products such as liquid crystal displays (LCDs), plasma display panels (PDPs), and organic light emitting diode (OLED) displays have been gradually commercialized and applied to various display apparatuses with different sizes. Without any exception, all of the manufacturers today are developing toward high brightness and high efficiency for fabricating a much more commercially profitable display. Among numerous flat display techniques developed today, liquid crystal displays have been considered as one of the most mature techniques. Evidently, electronic products including cellular phones, digital cameras, camcorders, notebook computers, and numerous other monitoring devices commonly used today are all variations of this technique.

In general, the transparency and the coloring of liquid crystal displays are controlled by the spinning of liquid crystal molecules, and by adjusting the transparency, the brightness of the display can also controlled. Essentially, when the color of the display remains unchanged, the position of the liquid crystal molecules also remains unchanged. Hence, the liquid crystal displays are characterized by advantages such as non-flashy and stable graphics. Despite the fact that the OLED has been developed later than the liquid crystal display (LCD), it still contains numerous beneficial characteristics, including a spontaneous light source, a wide viewing angle, quick response, low power consumption, high contrast and brightness, small thickness, full-color capability, simple structure, and a wide range of operating temperatures. All in all, the OLED has been applied extensively in various industries.

In addition, liquid crystal displays and organic light emitting diode displays are also active matrix displays driven by thin film transistors. The term active driving literally means the fabrication of numerous electronic devices including thin film transistors lined up in the form of arrays, pixel electrodes, interlinking scan lines and signal lines on the liquid crystal display, and several other devices in combination with corresponding capacitors and connection pad. The driving of a liquid crystal display essentially involves the driving of each pixel electrode by its independently driven circuit. In other words, when the thin film transistor within each independently driven circuit is turned on, a predetermined voltage will be sent to the corresponding pixel electrode and initiates the display to generate a picture. In contrast to a passive matrix display that adopts the method of driving the scan lines of the display in sequence thereby driving pixels in different rows sequentially, the light-emitting time of each pixel of the active matrix display is not restricted by the scanning frequency and the number of scan lines. Hence, the fabrication of the thin film transistor and its corresponding circuit is a critical stage in producing a large-size and high-resolution liquid crystal display.

Please refer to FIG. 1 to FIG. 3. FIG. 1 to FIG. 3 are schematic diagrams showing a method for fabricating at least one thin film transistor according to the prior art. As shown in FIG. 1, the thin film transistor of the prior art is a bottom gate structure. The thin film transistor 26 is essentially fabricated on an insulation substrate 10. The substrate 10 is comprised of a transparent material, such as a glass substrate, a quartz substrate, or a plastic substrate. The surface of the insulation substrate 10 further includes a predetermined source region 11, a predetermined drain region 12, and a predetermined channel region 13. A first sputtering process is performed first to form a first metal layer (not shown) on a surface of the insulation substrate 10. The first metal layer (not shown) is a tungsten layer, a tantalum layer, or other conductive metal layer. Next, a first photo-etching-process (PEP) is performed to form a gate electrode 14 on the surface of the insulation substrate 10. The gate electrode 14 is also positioned on top of the predetermined channel region 13.

Next, a first plasma enhanced chemical vapor deposition (PECVD) process is performed to form a silicon nitride layer 16 as a gate insulation layer on the surface of the gate electrode 14 and the insulation substrate 10. Next, a semiconductor layer 18 is formed on top of the silicon nitride layer 16. Also referred to as the active layer, the semiconductor layer 18 is a hydrogen-contained amorphous silicon layer that is also used as a passageway when the thin film transistor (not shown) is turned on. Next, an $n^+$ doped Si layer 22 comprising amorphous silicon doped with phosphor is deposited on top of the semiconductor layer 18.

As shown in FIG. 2, a second photo-etching-process is performed to remove part of the semiconductor layer 18 and the $n^+$ doped Si layer 22. By utilizing a second sputtering process, a second metal layer 24 is formed on top of the $n^+$ doped Si layer 22, semiconductor layer 18, and the silicon nitride layer 14. The second metal layer 24 is comprised of molybdenum, chrome, or tungsten.

As shown in FIG. 3, a third photo-etching-process is performed to form a source electrode 28 and a drain electrode 32 of a thin film transistor 26 between the second metal layer 24 and to expose a semiconductor layer 18 on top of the predetermined channel region 13. The source electrode 28 is located on top of the predetermined source region 11, part of the silicon nitride layer 16, and the doped $n^+$ layer 22 whereas the drain electrode 32 is located on top of the predetermined drain region 12, part of the silicon nitride layer 16, and the $n^+$ doped Si layer 22. The $n^+$ doped Si layer 22 functions to increase the Ohmic contact ability of the second metal layer 24 to the semiconductor layer 18 and ultimately reduces various problems caused by direct contact between the second metal layer 24 and the semiconductor layer 18 as a result of a significant difference in work function.

After the deposition of a dielectric layer 34, a fourth photo-etching-process is performed within the dielectric layer 34 that is located on top of the predetermined source region 111 and the predetermined drain region 12 to form a contact hole 36 that extends directly to the source electrode 28 and the drain electrode 32. After the contact hole 36 is filled with conducting materials, the source electrode 28 and the drain electrode 32 are electrically connected to a capacitor plate or an image signal line (both not shown) via a contact plug 38 to complete an electrical circuit.

Nevertheless, the fabrication method of the thin film transistor 26 according to the prior art often produces a serious problem. Since the semiconductor layer 18 is comprised of a hydrogen-contained amorphous silicon material, the mobility of the carriers often becomes limited when the thin film transistor 26 is turned on, thereby influencing the overall driving speed. Conversely, the electrical leakage also becomes excessively large when the thin film transistor 26 is turned off. At the same time, as the amorphous silicon is not defined by a specific structure, a meta-stable dangling bond phenomenon often results when any silicon atom is lacking one of its bonding atoms. The dangling bond phenomenon is essentially a defect that ultimately grabs electrons or disrupts the flow of the electrons. However, as the semiconductor layer 18 is a hydrogen-contained amorphous silicon layer, the hydrogen atom will readily combine with the silicon atom to form a bond at the location where the dangling bond is produced. Also, due to the fact that the hydrogen atom diffuses easily into the interface (a Si/SiN$_x$ interface) of the semiconductor layer 18 and the silicon nitride layer 16 and the discontinuous nature of the Si/SiN$_x$ interface, the hydrogen atom is easily trapped inside the Si/SiN$_x$ interface and eventually becomes an interface-trapped charge. In essence, the threshold voltage of a thin film transistor is the smallest gate voltage required when a strong inversion is generated at the semiconductor surface. The threshold voltage and the flat-band voltage are closely related and by generating the interface-trapped charge, the size of the flat-band voltage is altered and the stability and the life expectancy of the thin film transistor 26 are also greatly influenced.

As a result, another method has been developed according to the prior art for transforming the amorphous silicon material to a polysilicon material. Please refer to FIG. 4. FIG. 4 is a schematic diagram showing the means by which an amorphous silicon layer is processed via an excimer laser annealing process according to the prior art. As shown in FIG. 4, an excimer laser annealing process is performed after the formation of the amorphous silicon thin film 52 is formed and the insulation substrate 50 is placed into a closed chamber (not shown). When the excimer laser annealing process is performed, the amorphous silicon thin film 52 of the insulation substrate 50 is irradiated directly by an excimer laser pulse 54 through a transparent window (not shown) on top of the closed chamber. In addition, a predetermined area is also scanned by the laser pulse to rapidly heat up the amorphous silicon thin film 52 contained within the predetermined area. By absorbing the ultraviolet light from the laser, the amorphous silicon thin film 52 is rapidly melted and recrystallized to form polysilicon material.

However, the method stated previously also causes other serious problems. First, an extra excimer laser annealing step is added to the fabrication process and thereby significantly increases the overall time and cost. Secondly, when an excimer laser annealing process is performed, numerous variables are required to be controlled simultaneously. The variables include the hydrogen content of the amorphous silicon thin film, the thickness and smoothness of the thin film surface, the energy density of the laser, the spatial distribution of the laser, the degree of overlapping of the laser pulse, and the temperature and surrounding environmental atmosphere when the laser annealing process is performed. Typically, the quality of the active polysilicon thin film within the passageway becomes difficult to control if the fabrication process is not properly regulated. In addition, the laser crystallization process is essentially a low temperature solid phase recrystallization process that characterizes a long processing time. Consequently, the grains are only able to grow to a certain size and the grain size is also difficult to control. Eventually, the overall carrier mobility and the control of electrical leakage are greatly affected.

Therefore, it becomes a great challenge to develop a fabrication process that is capable of producing a semiconductor layer containing an expected microcrystalline structure and achieving a satisfactory carrier mobility and low electrical leakage by utilizing the semiconductor layer as an active layer of a thin film transistor.

SUMMARY OF INVENTION

It is therefore an objective of the claimed invention to provide a method for fabricating a thin film transistor and related circuits for solving the problems stated previously.

According to the present invention, a method of forming a thin film transistor on a substrate, the surface of the substrate including a gate electrode with a gate insulation layer disposed thereon, comprising: (a) depositing a silicon-contained thin film on the gate insulation layer; (b) plasma etching the silicon-contained thin film; (c) repeating steps (a) and (b) for forming an interface layer; and (d) forming an amorphous silicon layer, a source/drain metal layer to form a channel, a source electrode, and a drain electrode on the interface layer.

In order to fabricate a thin film transistor, the present invention includes a deposition process by utilizing diluted silane in hydrogen for forming a silicon-contained thin film on the gate insulation layer. A hydrogen plasma etching process is thereafter performed to etch the amorphous silicon composition and also provide a suitable growing condition for a microcrystalline thin film. The deposition process and the etching process are performed repeatedly and interchangeably for fabricating an interface layer, an amorphous silicon layer, n$^+$ doped Si layers, a source electrode, and a drain electrode.

Due to the microstructure of the microcrystalline material of interface layer, various factors including the size of the grains, the void ratio, and the crystallization ratio are easily controlled during the fabrication process. Therefore, it becomes evident that the interface layer is able to further enhance the characteristics and functionality of the amorphous silicon layer and the gate insulation layer. Consequently, not only is the carrier mobility of the thin film transistor well maintained when the thin film transistor is turned on, but also the electrical leakage is controlled within a range lesser than the thin film transistor of the prior art when the thin film transistor is turned off.

Also, due to the fact that the characteristics of the interface is well improved, the dangling bond phenomenon generated from the Si/SiN$_x$ interface of the prior art is also greatly controlled, thereby further extends the stability of the threshold voltage and life expectancy of the thin film transistor. By utilizing the present invention, the total fabrication time is likely to remain the same as the entire active layer is not deposited to become a microcrystalline silicon layer and no additional equipments are needed as the entire process can be completed via original PECVD equipments.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
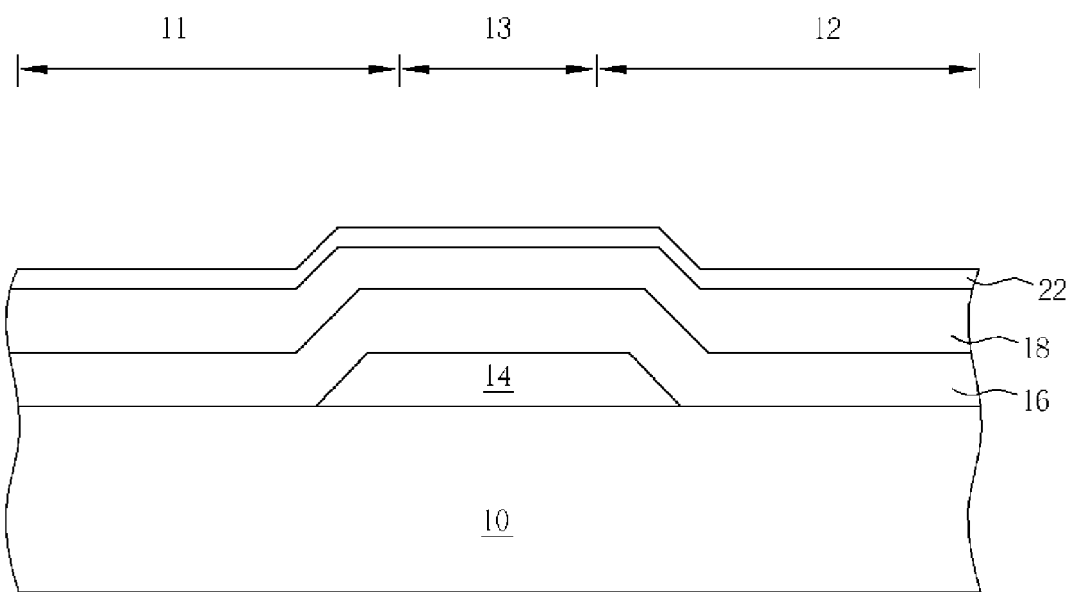
FIG. 1 to FIG. 3 are schematic diagrams showing the method for fabricating at least one thin film transistor according to the prior art.
Figure 2:
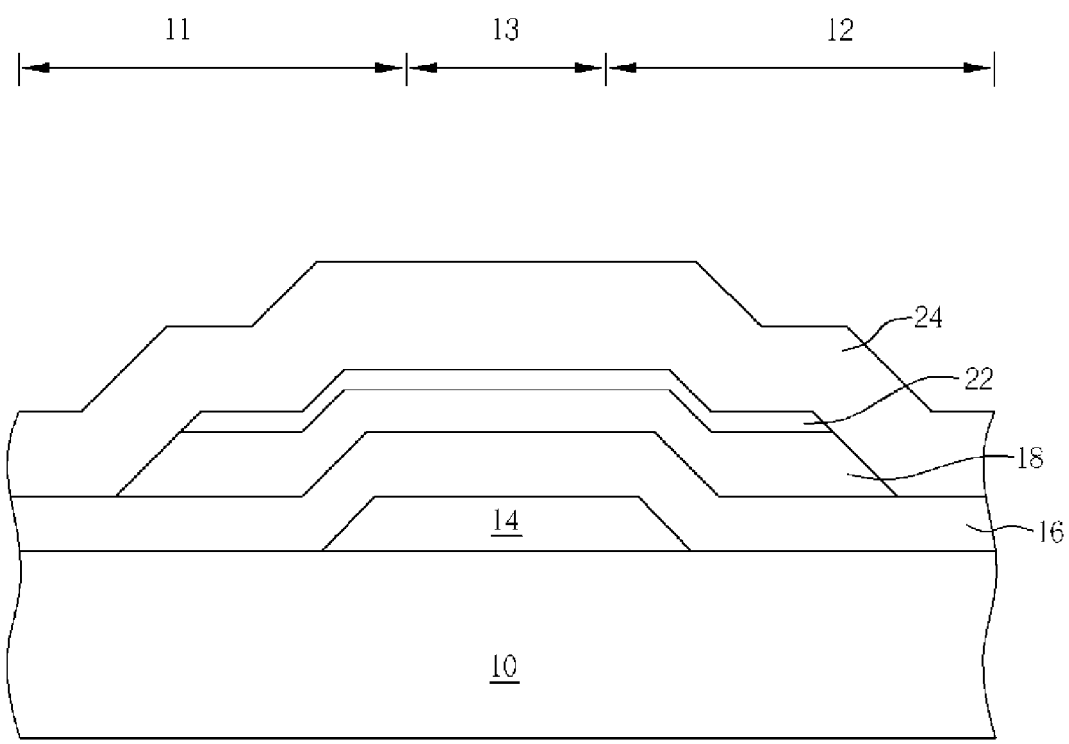
Figure 3:
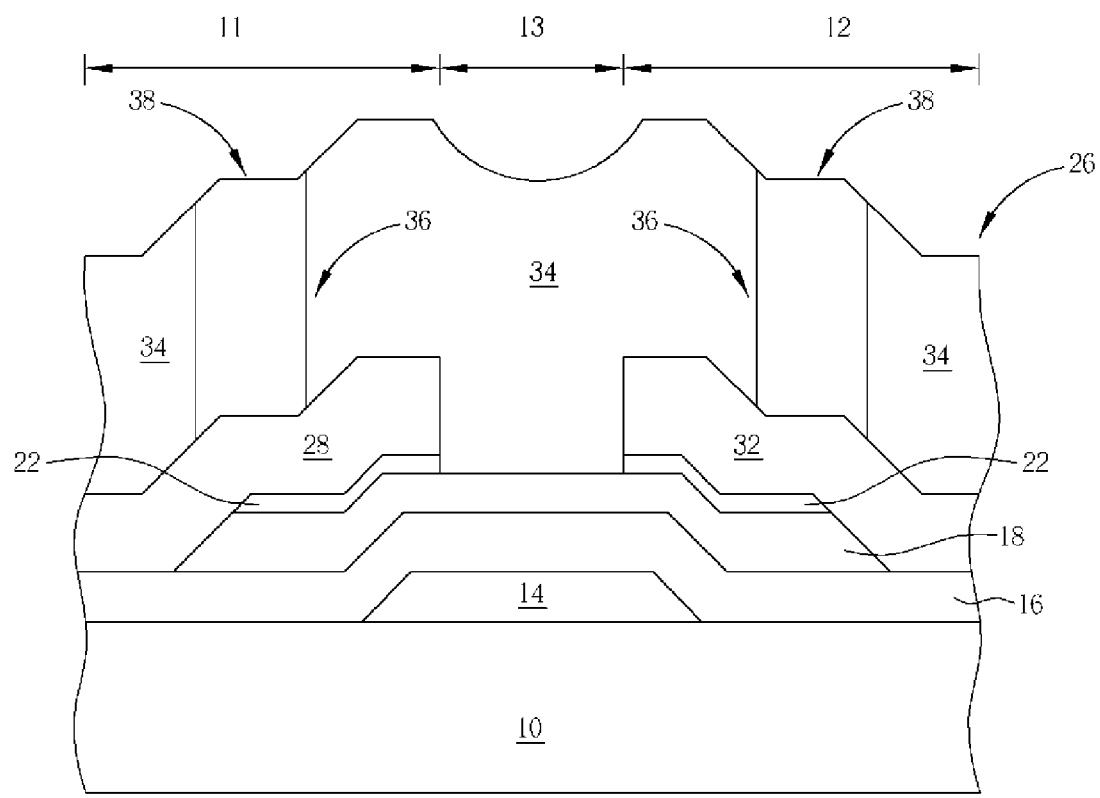
Figure 4:
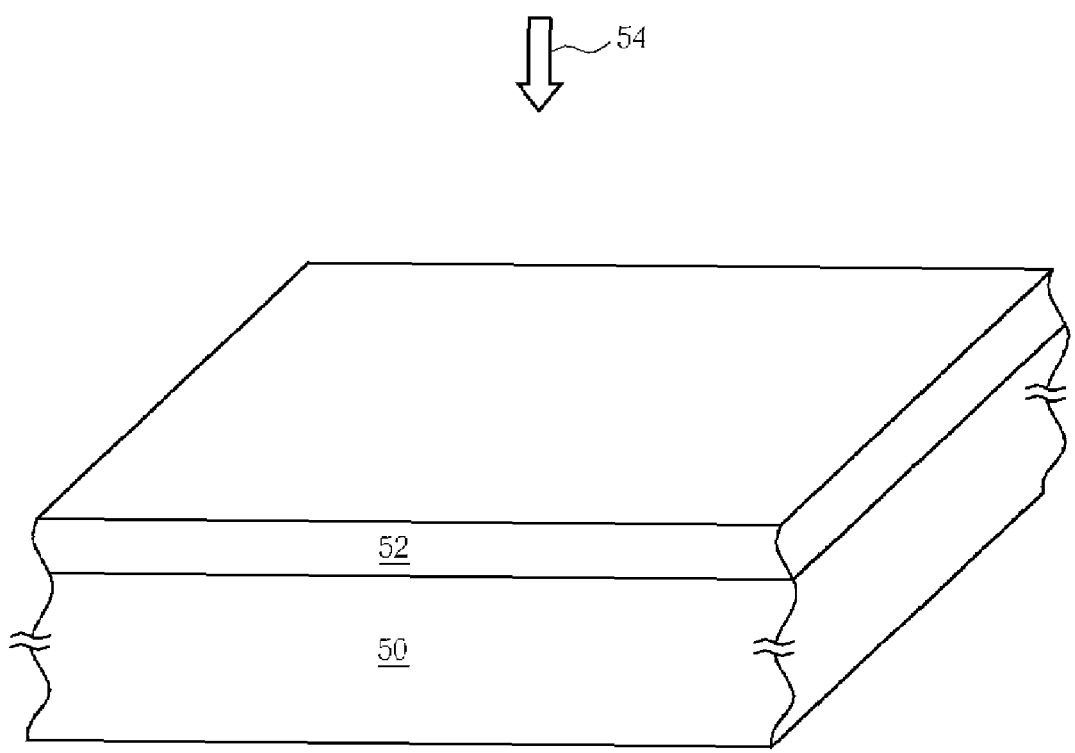
FIG. 4 is a schematic diagram showing the means by which an amorphous silicon layer is processed via an excimer laser annealing process according to the prior art.
Figure 5:
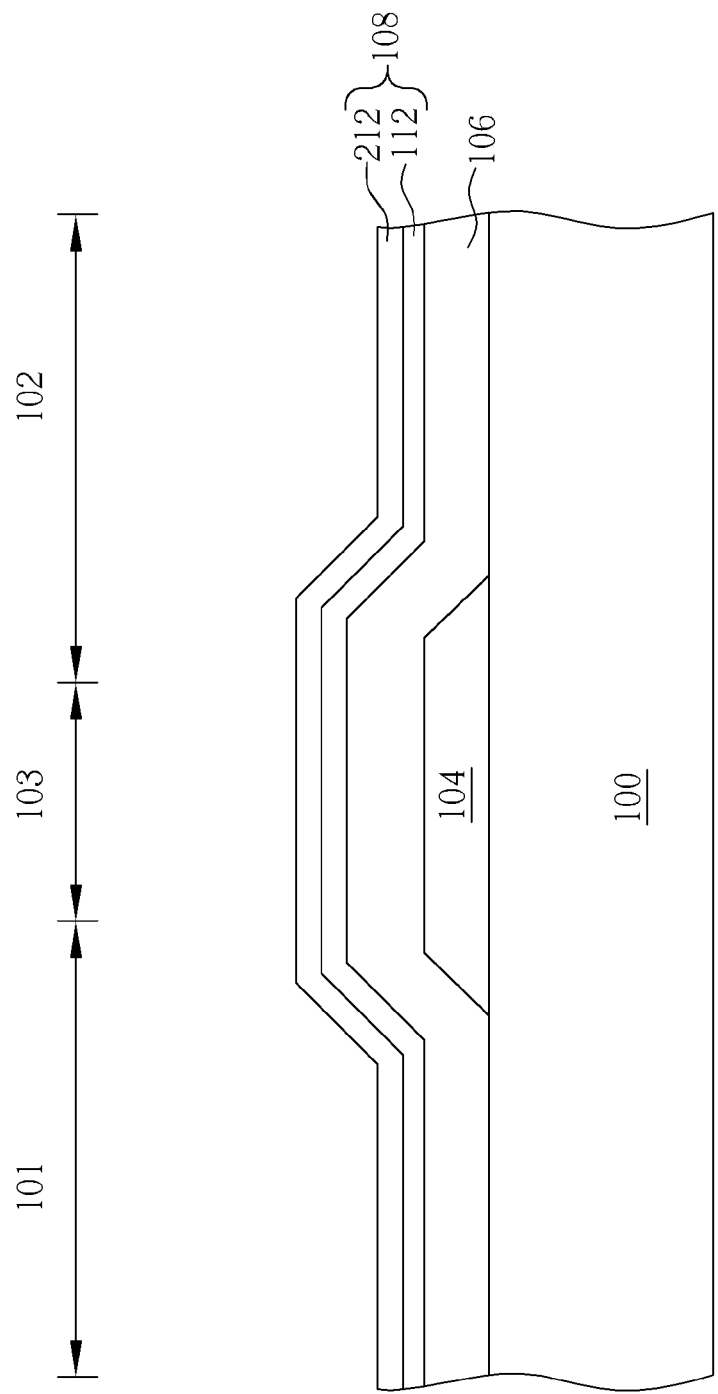
FIG. 5 to FIG. 8 are schematic diagrams of the first embodiment of the present invention for fabricating at least one thin film transistor.

Please refer to FIG. 5 to FIG. 8. FIG. 5 to FIG. 8 are schematic diagrams of the first embodiment of the present invention for fabricating at least one thin film transistor 122. As shown in FIG. 5, the thin film transistor of the first preferred embodiment of the present invention is a bottom gate structure. The thin film transistor 122 is essentially fabricated on an insulation substrate 100. The substrate 100 is comprised of a transparent material, such as a glass substrate, a quartz substrate, or a plastic substrate. A predetermined source region 101, a predetermined drain region 102, and a predetermined channel region 103 are formed on a surface of the insulation substrate 100. A first sputtering process is performed first to form a first metal layer (not shown) on a surface of the insulation substrate 100. The first metal layer (not shown) may be a single-layered metal layer or a multi-layered metal layer. The single-layered metal layer and the multi-layered metal layer are comprised of materials such as aluminum, molybdenum, chrome, tungsten, tantalum, copper, or any alloy created from the metals above. Next, a first photo-etching-process-1 (PEP-1) is performed to form a gate electrode 104 on the surface of the insulation substrate 100. The gate electrode 104 is positioned on top of the predetermined channel region 103.

Next, a first plasma enhanced chemical vapor deposition (PECVD) process is performed to form a silicon nitride layer 106 as a gate insulation layer on the surface of the gate electrode 104 and the insulation substrate 100. The gate insulation layer may be a single-layered insulation layer or a multi-layered insulation layer, and the layer is comprised of materials such as tantalum pentoxide, tantalum oxide, aluminum trioxide, silicon oxide, silicon nitride, or oxynitride. Next, an interface layer 108 is formed on the surface of the silicon nitride layer 106. The interface layer formation typically involves the following procedures: a second PECVD process is carried out to form a silicon-contained thin film 112 by utilizing a reaction gas of diluted silane in hydrogen. The silicon-contained thin film 112 is then exposed to a hydrogen plasma by utilizing hydrogen as a reaction gas to carry out a plasma etching process. Another silicon-contained thin film 212 is deposited thereafter on the silicon-contained thin film by another PECVD process and the deposited silicon contained thin film 212 is also plasma etched thereafter by exposing to hydrogen plasma. Depending on the manufacturing need, the PECVD and the etching process are carried out interchangeably to form the silicon-contained thin films 112 and 212 into an interface layer 108, as shown in FIG. 5. After being treated by the hydrogen plasma, the amorphous composite of the silicon-contained thin films 112 and 212 is etched and consequently, the more amorphous composite being etched, the more advantageous it becomes for the expansion of the microcrystalline silicon thin film. In fact, the silicon-contained thin films 112 and 212 not treated by the hydrogen plasma can also be regarded as a type of microcrystalline thin film. Nevertheless, the untreated silicon-contained thin film still demonstrates a substantially reduced quality in grain size, crystallization ratio, and void ratio in comparison with the one treated with hydrogen plasma. The formation of the interface layer 108 is also referred to as a layer-after-layer technique as the layers are achieved repeatedly by utilizing the PECVD and the etching process interchangeably.

In the diluted silane in hydrogen of the preferred embodiment of present invention, the discharge ratio of silane to hydrogen is between 0.3-2%, the total response time ratio of PECVD to etching process is between 0.3-1, the PECVD and etching process are utilized at least ten times interchangeably, and the thickness of a single silicon-contained thin film 112 or 212 is less than 50 angstroms (Å). In the same time, the power density is 200 mW/cm$^2$ and the pressure is maintained at approximately 1200 milli-Torr. Due to the fact that the interface layer 108 contacted by the silicon nitride layer 106 (as discussed previously, which may be comprised of other materials) ultimately becomes a microcrystalline silicon structure, the layer itself not only exhibits a much better electrical property compared with other prior art amorphous structures, but also demonstrates an improved interface property of the gate insulation layer than those from the prior art. Evidently, the present invention provides a significant solution to numerous problems found in the prior art thin film transistors, such as excessive electrical leakage, instability, and low life expectancy and by comparing with a polysilicon structure, the microstructure of the present invention can also have lower electrical leakage without the additional heat treatment.

Figure 6:
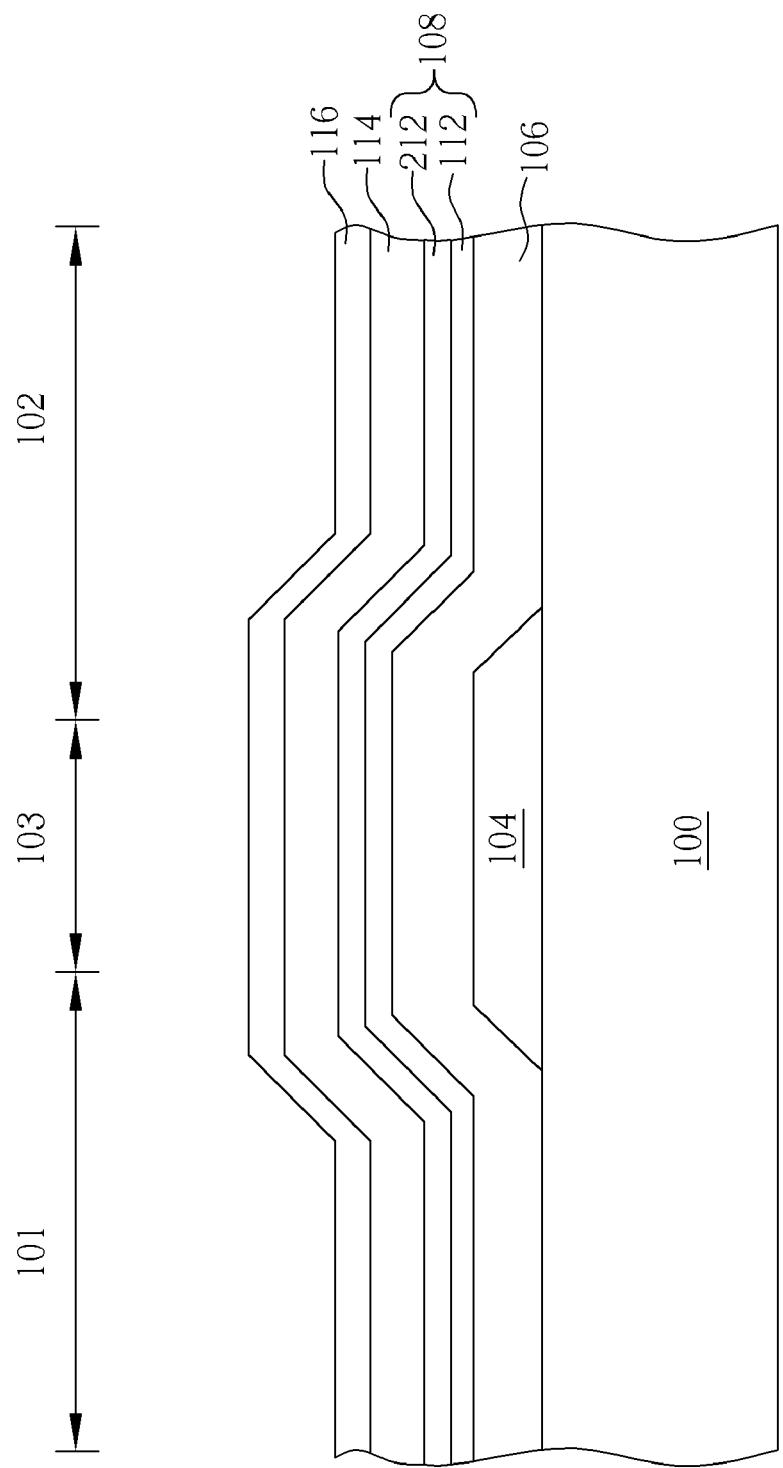

As shown in FIG. 6, a semiconductor layer 114, also being a hydrogen-contained amorphous silicon layer, is formed on top of the interface layer 108. Next, a n$^+$ doped Si layer 116 is formed on top of the semiconductor layer 114 via a deposition process. The n$^+$ doped Si layer 116 is composed of amorphous silicon doped with phosphor, arsenic, or stibium. Essentially, the amorphous silicon layer is formed by a chemical vapor deposition process whereas the n$^+$ doped Si layer is formed by another chemical vapor deposition process. Alternatively, the silicon nitride layer 106, the interface layer 108, the semiconductor layer 114, and the n$^+$ doped Si layer 116 that eventually become the gate insulation layer can be deposited in situ by a series of PECVD processes. Hence, the fabrication process becomes much simpler as the insulation substrate 100 is not required to be removed from the reaction chamber. At the same time, the fact that it is not essential to deposit the entire active layer to become the microcrystalline silicon layer also provides a desirable option for mass production.

Figure 7:
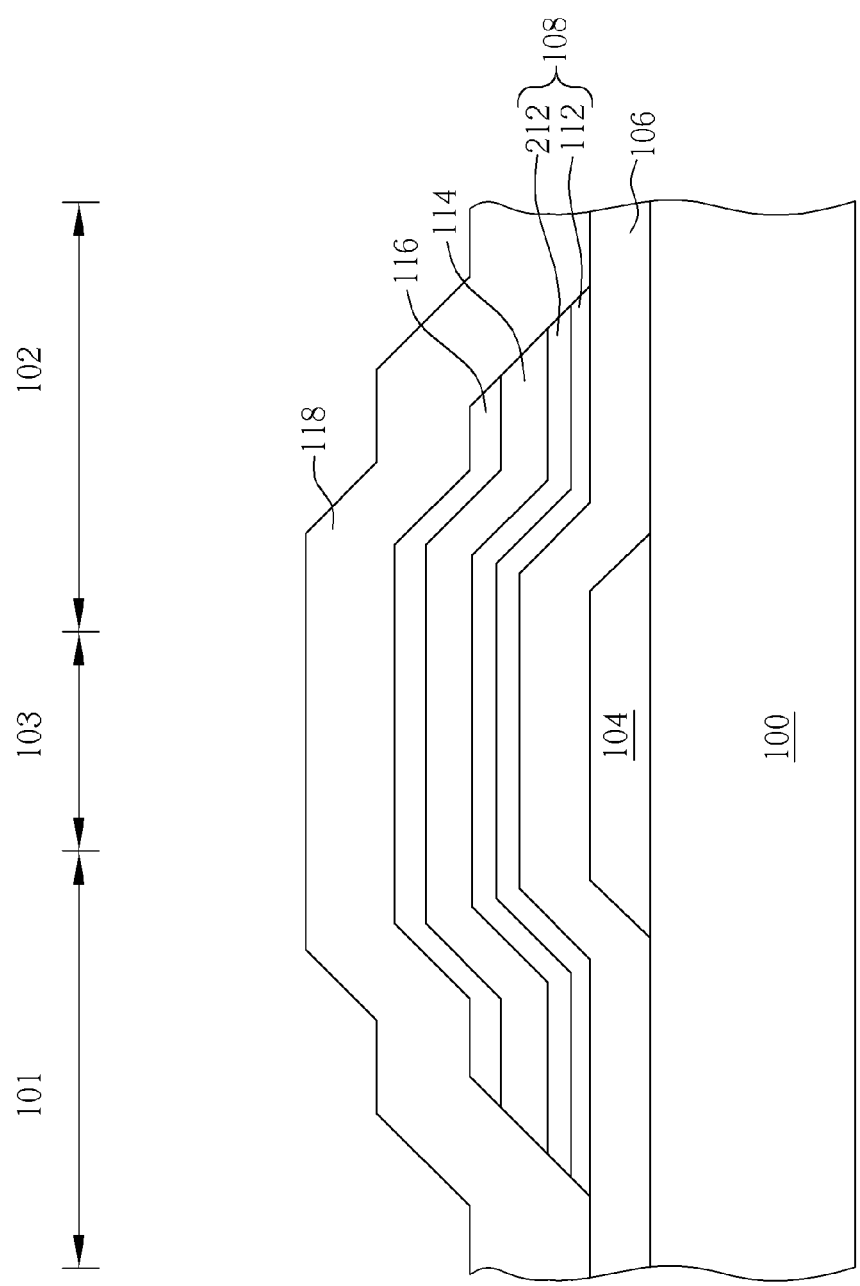

As shown in FIG. 7, a second photo-etching-process is performed to remove part of the interface layer 108, semiconductor layer 114, and the n$^+$ doped Si layer 116. Next, a physical gas deposition process is performed to form a second metal layer 118 on top of the silicon nitride layer 106, the interface layer 108, the semiconductor layer 114, and the n$^+$ doped Si layer 116. The second metal layer 118 may be a single-layered metal layer or a multi-layered metal layer. The single metal layer or other metal layers are composed of materials such as aluminum, molybdenum, chrome, tungsten, tantalum, copper, or any alloy made from the metals above.

Figure 8:
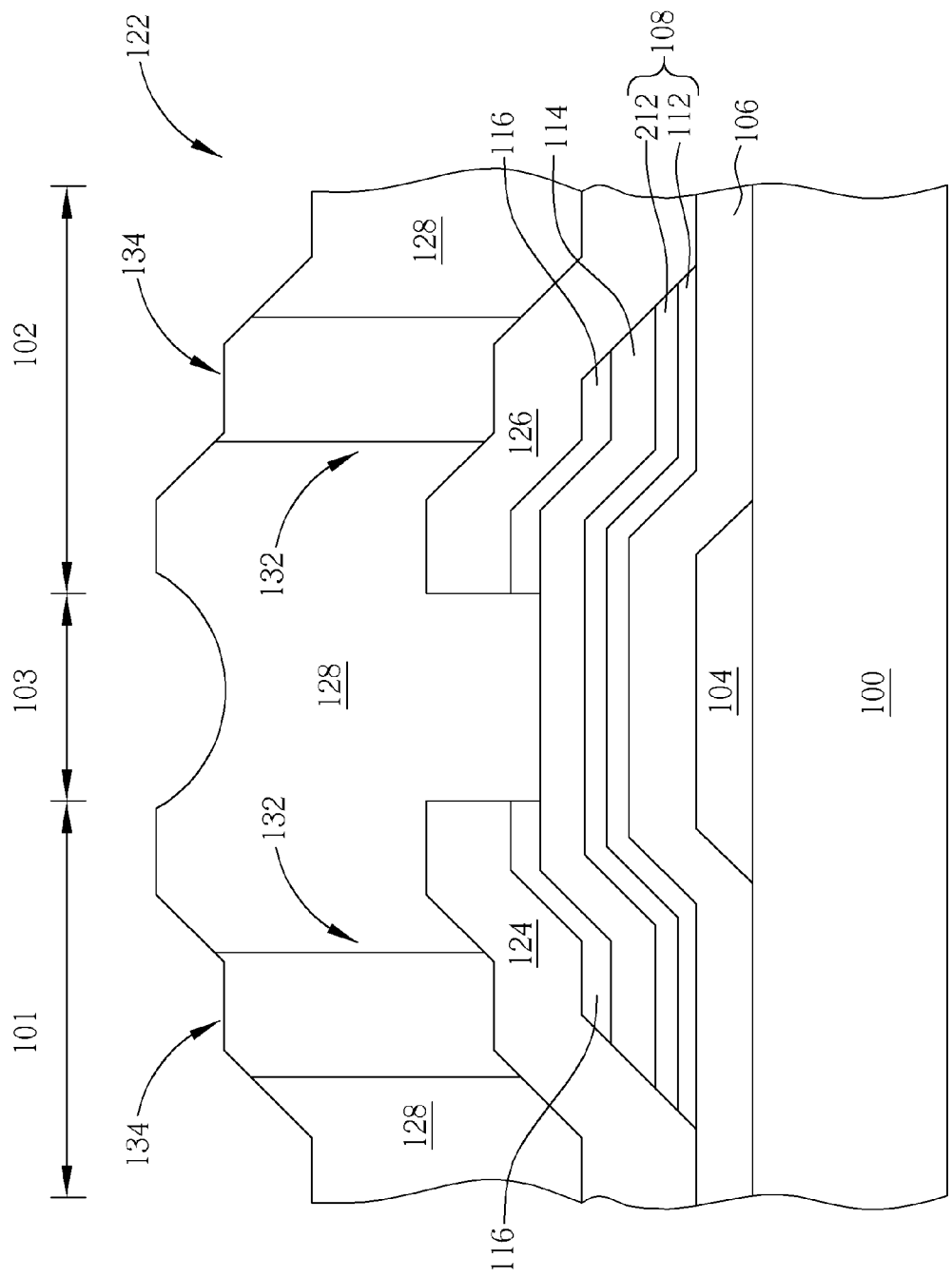

As shown in FIG. 8, a third photo-etching-process is performed to form a source electrode 124 and a drain electrode 126 of a thin film transistor 122 between the second metal layer 118 and to expose a semiconductor layer 114 on top of the predetermined channel region 103. The source electrode 124 is located on top of the predetermined source region 101, part of the silicon nitride layer 106, and the n$^+$ doped Si layer 116 whereas the drain electrode 126 is located on top of the predetermined drain region 102, part of the silicon nitride layer 106, and the n$^+$ doped Si layer 116. The n$^+$ doped Si layer 116 functions to increase the Ohmic contact ability of the second metal layer 118 to the semiconductor layer 114 and ultimately reduce various problems caused by direct contact between the second metal layer 118 and the semiconductor layer 114 as a result of a significant difference in the work function.

Formed at last, a dielectric layer 128 includes a silicon nitride layer or a polyimide layer for protection purposes. Within the dielectric layer 128 that positioned on the top portion of the predetermined source region 101 and the predetermined drain region 102, a fourth photo-etching-process is performed to form a contact hole 132 that extends directly to the source electrode 124 and the drain electrode 126. After the contact hole 132 is filled with conducting materials, the source electrode 124 and the drain electrode 126 are electrically connected to a capacitor plate or image signal line (both not shown) via a contact plug 134 to complete an electric circuit.

Figure 9:
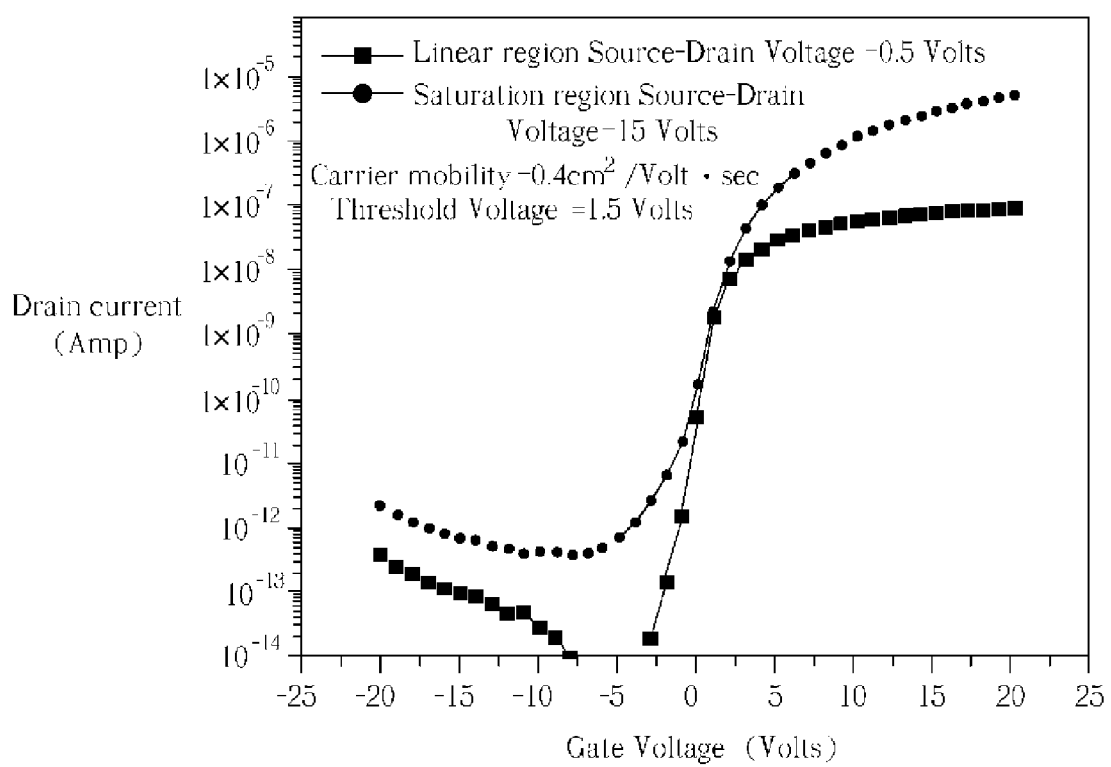
FIG. 9 is a property transformation diagram showing the thin film transistor of the first embodiment of the present invention.

Please refer to FIG. 9. FIG. 9 is a property transformation diagram showing the thin film transistor of the first embodiment of the present invention. FIG. 9 also includes a measurement result of a gate voltage that fluctuates from −20 volts to 20 volts. As shown in the figure, the source-drain voltage measures 0.5 volts in a linear region and 15 volts in a saturation region. By comparing with the thin film transistor 26 of the prior art, the thin film transistor 122 of the present invention demonstrates a much lower electrical leakage, despite the fact that its carrier mobility and threshold voltage are still relatively close to that of the prior art thin film transistor 26.

Figure 10:
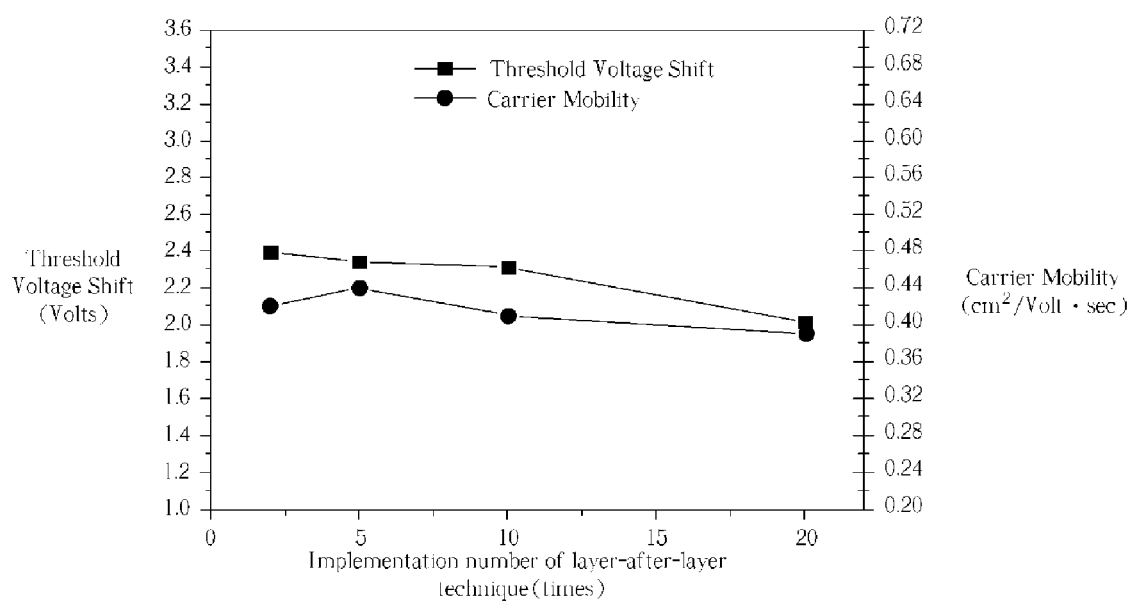
FIG. 10 is a relational diagram illustrating the effect of the number of layer-after-layer technique on the threshold voltage shift and the carrier mobility during thin film transistor fabrication according to the first embodiment of the present invention.

Please refer to FIG. 10. FIG. 10 is a relational diagram illustrating the effect of the number of layer-after-layer technique on the threshold voltage shift and the carrier mobility during thin film transistor fabrication according to the first embodiment of the present invention. As shown in FIG. 10, the thin film transistor 122 of the present invention demonstrates a significant advantage over the thin film transistor 26 of the prior art in that as the number of processing increases, the threshold voltage shift also decreases gradually, despite the fact that the carrier mobility only decrease slightly.

Figure 11:
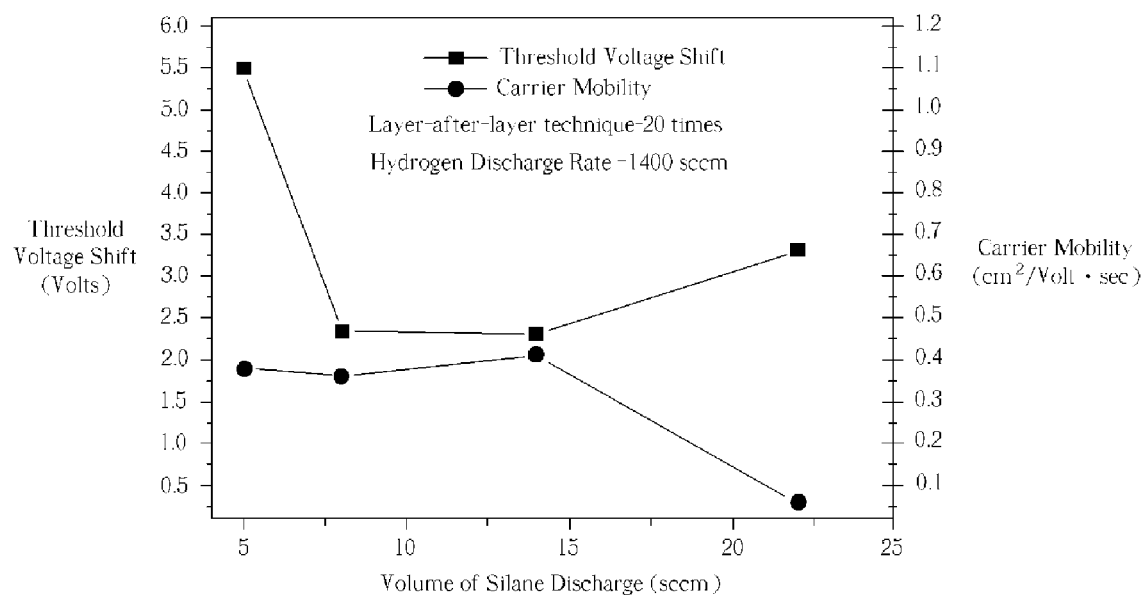
FIG. 11 is a relational diagram illustrating the effect of the silane discharge to the threshold voltage shift and the carrier mobility during the deposition process according to the first embodiment of the present invention.

Please refer to FIG. 11. FIG. 11 is a relational diagram illustrating the effect of the silane discharge to the threshold voltage shift and the carrier mobility during the deposition process according to the first embodiment of the present invention. As shown in FIG. 11, the threshold voltage of the thin film transistor 122 increases significantly and the carrier mobility also decreases notably and ultimately causes an electrical degradation of the thin film transistor 122 when the volume of silane discharge is greater than 14 standard cubic centimeters per minute (SCCM). Due to the excessively high silane discharge, the growth of the amorphous silicon structure formed within the thin film becomes exceedingly fast and ultimately causes a partial roughening on the amorphous silicon surface as the entire amorphous silicon composite is not completely etched during the plasma etching process. Hence, the volume ratio of silane to hydrogen is controlled between 0.3 to 2% during the deposition process for fabricating a thin film transistor 122 with a desirable electrical property.

Figure 12:
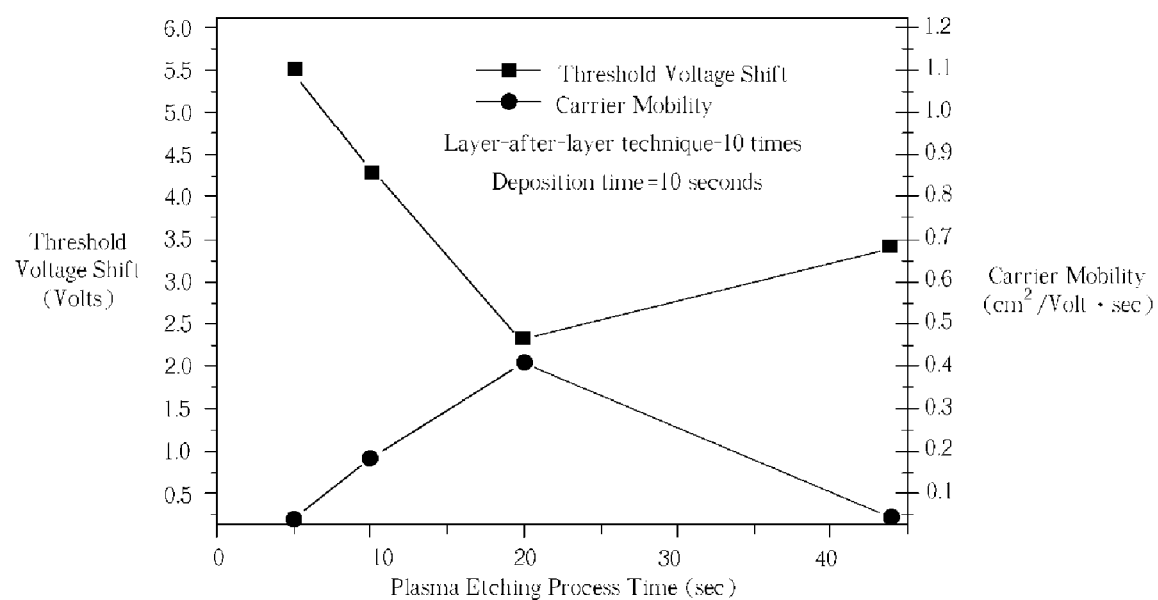
FIG. 12 is a relational diagram illustrating the effect of response time of plasma etching process to the threshold voltage shift and the carrier mobility according to the first embodiment of the present invention.

Please refer to FIG. 12. FIG. 12 is a relational diagram illustrating the effect of response time of plasma etching process to the threshold voltage shift and the carrier mobility according to the first embodiment of the present invention. As shown in FIG. 12, the electrical property of the thin film transistor 122 becomes significantly worse when the total response time of the deposition process to plasma etching process is not controlled within 0.3 to 1.

Figure 13:
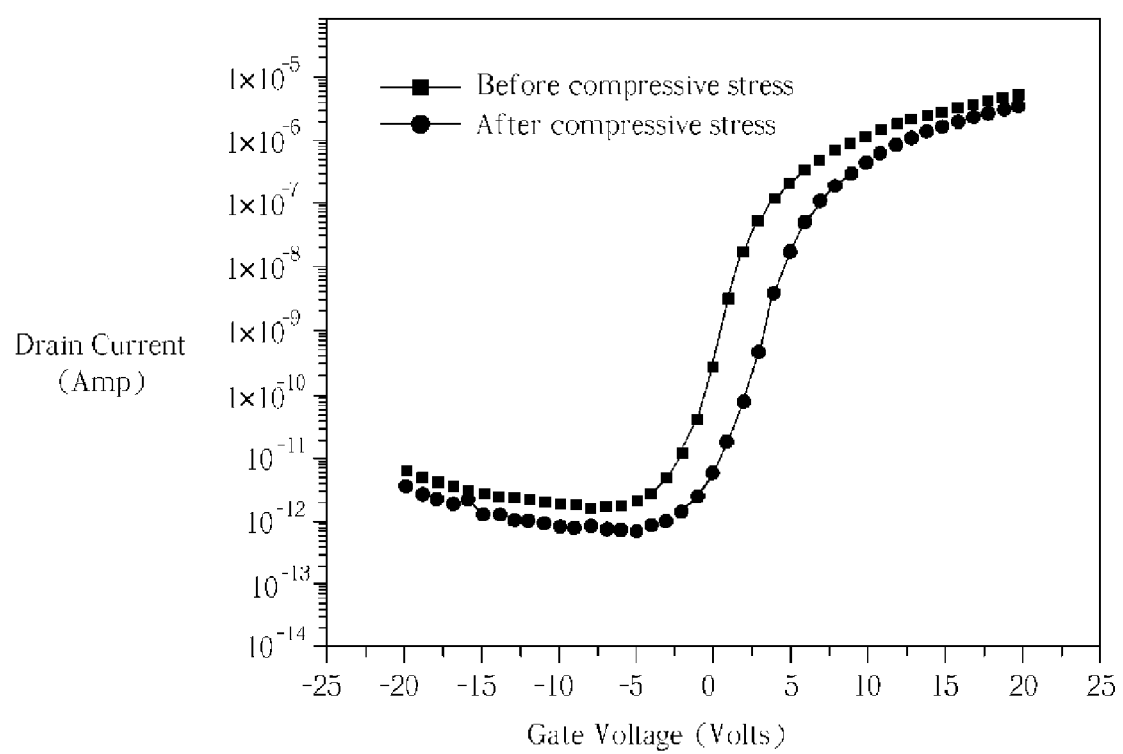
FIG. 13 is a property diagram illustrating the condition when the thin film transistor is under a compressive stress according to the first embodiment of the present invention.

Please refer to FIG. 13. FIG. 13 is a property diagram illustrating the condition when the thin film transistor is under a compressive stress according to the first embodiment of the present invention. As shown in FIG. 13, the threshold voltage shift of the thin film transistor 122 according to the present invention is measured at 2.2 volts (where the drain electrode is referred to as a turn-on) after 1000 seconds and under the same condition, the threshold voltage shift of the thin film transistor 26 according to the prior art is measured at 3.5 volts. The threshold voltage shift is essentially caused by a metastable dangling bond in the Si/SiN$_x$ interface.

Figure 14:
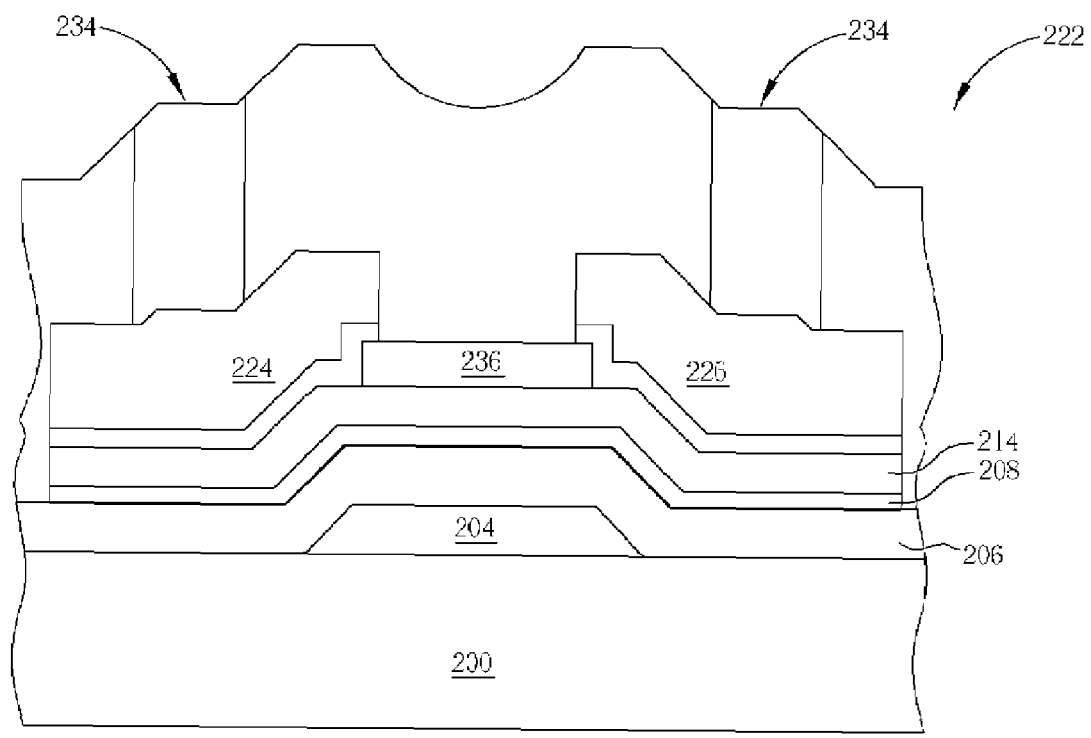
FIG. 14 is a schematic diagram of showing the thin film transistor of the second embodiment of the present invention.

In addition to fabricating the thin film transistor 26 of the first embodiment, the present invention is also applicable for fabricating another thin film transistor 222 of the second embodiment. Please refer to FIG. 14. FIG. 14 is a schematic diagram showing the thin film transistor of the second embodiment of the present invention. As shown in FIG. 14, the thin film transistor 222 of the second embodiment includes a bottom gate electrode structure and in contrast to the thin film transistor 26 of the first embodiment, an etch stop layer (not shown) comprised of silicon nitride is deposited on top of the glass substrate 200 after the formation of the semiconductor layer 214. In fact, the gate insulation layer 206, the interface layer 208, the semiconductor layer 214, and the etch stop layer (not shown) is deposited in situ by a series of PECVD process. Next, a photo-etching-process is performed to form an etch stop pattern 236 on the gate electrode 204 for preventing the semiconductor layer 214 from being etched by the etching process afterwards. After all fabrication processes are completed, the source electrode 226 and the drain electrode 226 are electrically connected to a capacitor plate or an image signal line (both not shown) via a contact plug 234 to complete an electric circuit.

In order to fabricate a thin film transistor, the present invention includes a deposition process by utilizing diluted silane in hydrogen for forming a silicon-contained thin film on the gate insulation layer. A hydrogen plasma etching process is thereafter performed to etch the amorphous silicon composition and also provide a suitable growing condition for a microcrystalline thin film. The deposition process and the etching process are performed repeatedly and interchangeably for fabricating an interface layer. Due to the microstructure of the microcrystalline material of interface layer, various factors including the size of the grain, the void ratio, and the crystallization ratio are easily controlled during the fabrication process. Therefore, it becomes evident that the interface layer is able to further enhance the characteristics and functionality of the amorphous silicon layer and the gate insulation layer. By utilizing the present invention in a real production line, it is able to produce a thin film transistor with adequate carrier mobility, low electrical leakage, stable threshold voltage, and at the same time, maintain a reasonable fabrication time and cost.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a thin film transistor on a substrate, the surface of the substrate including a gate electrode with a gate insulation layer disposed thereon, comprising:
   (a) depositing a first silicon-contained thin film on the gate insulation layer;
   (b) plasma etching the first silicon-contained thin film;
   (c) depositing a second silicon-contained thin film on the first silicon-contained thin film after plasma etching the first silicon-contained thin film;
   (d) plasma etching the second and the first silicon-contained thin films for forming the first silicon-contained thin film and the second silicon-contained thin film into an interface layer with a microcrystalline structure; and
   (e) forming an amorphous silicon layer and an ohmic contact layer on the amorphous silicon layer, performing a photo-etching process to remove a portion of the interface layer, the amorphous silicon layer, and the ohmic contact layer, and depositing a source/drain metal layer on the interface layer after performing the photo-etching process to form a channel, a source electrode, and a drain electrode, wherein the ohmic contact layer disposes between the source/drain metal layer and the amorphous silicon layer.

2. The method of claim 1, wherein depositing a silicon-contained thin film on the gate insulation layer is facilitated by the utilization of hydrogen diluted silane.

3. The method of claim 2, wherein the hydrogen diluted silane comprises silane and hydrogen gas and the flow ratio of the silane to the hydrogen gas is about 0.30% to 2%.

4. The method of claim 1, wherein plasma etching the silicon-contained thin film is facilitated by utilizing hydrogen as a reaction gas.

5. The method of claim 1, wherein the ohmic contact layer is an $n^+$ doped Si layer.

6. The method of claim 5, wherein the n+ doped Si layer is doped with phosphor, arsenic, or stibium.

7. The method of claim 1, wherein the substrate includes a glass substrate, a quartz substrate, or a plastic substrate.

8. The method of claim 1, wherein the gate electrode is a multi-metal-layer and each layer of the multi-metal-layer is comprised of aluminum, molybdenum, chrome, tungsten, tantalum, copper, or any alloy made thereof.

9. The method of claim 1, wherein the thickness of the silicon-contained thin film is less than about 50 angstroms (Å).

10. The method of claim 1, wherein steps (c) and (d) are repeated at least ten times.

11. The method of claim 1, wherein the response time ratio of step (c) to step (d) is between 0.3 and 1.

12. The method of claim 1, wherein the amorphous silicon layer is formed by a chemical vapor deposition.

13. The method of claim 1, wherein the gate insulation layer, the interface layer, and the amorphous silicon layer are formed by plasma enhanced chemical vapor deposition.

14. The method of claim 13, further comprising forming a contact plug within the protective layer for electrically connecting the source and drain electrodes to a capacitor or an image signal line.

15. The method of claim 1, further comprising forming a protective layer on the thin film transistor.

16. A method of forming a thin film transistor on a substrate, the surface of the substrate including a gate electrode with a gate insulation layer disposed thereon, comprising:
   (a) depositing a first silicon-contained thin film on the gate insulation layer;
   (b) plasma etching the first silicon-contained thin film;
   (c) depositing a second silicon-contained thin film on the first silicon-contained thin film after plasma etching the first silicon-contained thin film;
   (d) plasma etching the first and the second silicon-contained thin films by utilizing hydrogen as a reaction gas for forming microcrystalline structure; and
   (e) forming an amorphous silicon layer, a source/drain metal layer to form a channel, a source electrode, and a drain electrode on the silicon-contained thin film.

17. The method of claim 16, further comprising repeating steps (c) to (d).

18. The method of claim 16, wherein the response time ratio of step (c) to step (d) is between 0.3 and 1.

19. The method of claim 16, wherein depositing a silicon-contained thin film on the gate insulation layer is facilitated by the utilization of hydrogen diluted silane.

20. The method of claim 19, wherein the hydrogen diluted silane comprises silane and hydrogen gas and the flow ratio of the silane to the hydrogen gas is about 0.3% to 2%.

21. The method of claim 16, wherein the thickness of the silicon-contained thin film is less than about 50 angstroms (Å).

22. The method of claim 16, further comprising forming an ohmic contact layer between the amorphous silicon layer and the source/drain metal layer, wherein the ohmic contact layer is an $n^+$ doped Si layer doped with phosphor, arsenic, or stibium.

* * * * *